United States Patent [19]
Mikata et al.

[11] Patent Number: 5,234,869
[45] Date of Patent: Aug. 10, 1993

[54] METHOD OF MANUFACTURING SILICON NITRIDE FILM

[75] Inventors: Yuuichi Mikata, Kawasaki; Takahiko Moriya, Yokohama, both of Japan

[73] Assignee: Kabushiki Kaisha Toshiba, Kawasaki, Japan

[21] Appl. No.: 721,819

[22] Filed: Jun. 26, 1991

[30] Foreign Application Priority Data

Jun. 28, 1990 [JP] Japan .................. 2-171156

[51] Int. Cl.⁵ .......................................... H01L 21/02
[52] U.S. Cl. ................................ 437/241; 437/235; 437/243; 148/DIG. 14
[58] Field of Search ............... 437/242, 235, 243; 148/DIG. 114

[56] References Cited

U.S. PATENT DOCUMENTS

| | | | |
|---|---|---|---|
| 4,158,717 | 6/1979 | Nelson | 437/241 |
| 4,699,825 | 10/1987 | Sakai et al. | 437/241 |
| 4,702,936 | 10/1987 | Maeda et al. | 437/241 |
| 4,855,258 | 8/1989 | Allman et al. | 437/241 |
| 4,877,651 | 10/1989 | Dory | 437/241 |
| 4,992,306 | 2/1991 | Hochberg et al. | 437/241 |
| 5,040,046 | 8/1991 | Chhabra et al. | 437/241 |

OTHER PUBLICATIONS

Rosler, R. S., "Low Pressure CVD Production Processes for Poly, Nitride, and Oxide," Solid State Technology, Apr. 1977, pp. 63–70.

Roenigk, K. F., et al., "Low Pressure CVD of Silicon Nitride," Journal of the Electrochemical Society, No. 7, Jul. 1987, pp. 1777–1785.

Rosler, R. S., et al., "Plasma Enhanced CVD in a Novel LPCVD-Type System," Extended Abstracts, vol. 80-1, May 1980, p. 249.

European Search Report, App. No. EP 91 11 0256 completed Feb. 26, 1992 by Examiner G. O. Zollfrank at The Hague.

*Primary Examiner*—Brian E. Hearn
*Assistant Examiner*—Trung Dang
*Attorney, Agent, or Firm*—Finnegan, Henderson, Farabow, Garrett & Dunner

[57] ABSTRACT

According to this invention, there is disclosed a method of manufacturing a silicon nitride film on a semiconductor substrate using a low-pressure CVD apparatus, including the steps of setting a plurality of semiconductor wafers in a boat in a reaction furnace, increasing a temperature in the reaction tube to a predetermined temperature and decreasing a pressure in the reaction tube to a predetermined pressure, and supplying $Si(N(CH_3)_2)_4$ gas from a first gas source to the reaction tube and supplying $NH_3$ gas from a second gas source to the reaction tube.

6 Claims, 2 Drawing Sheets

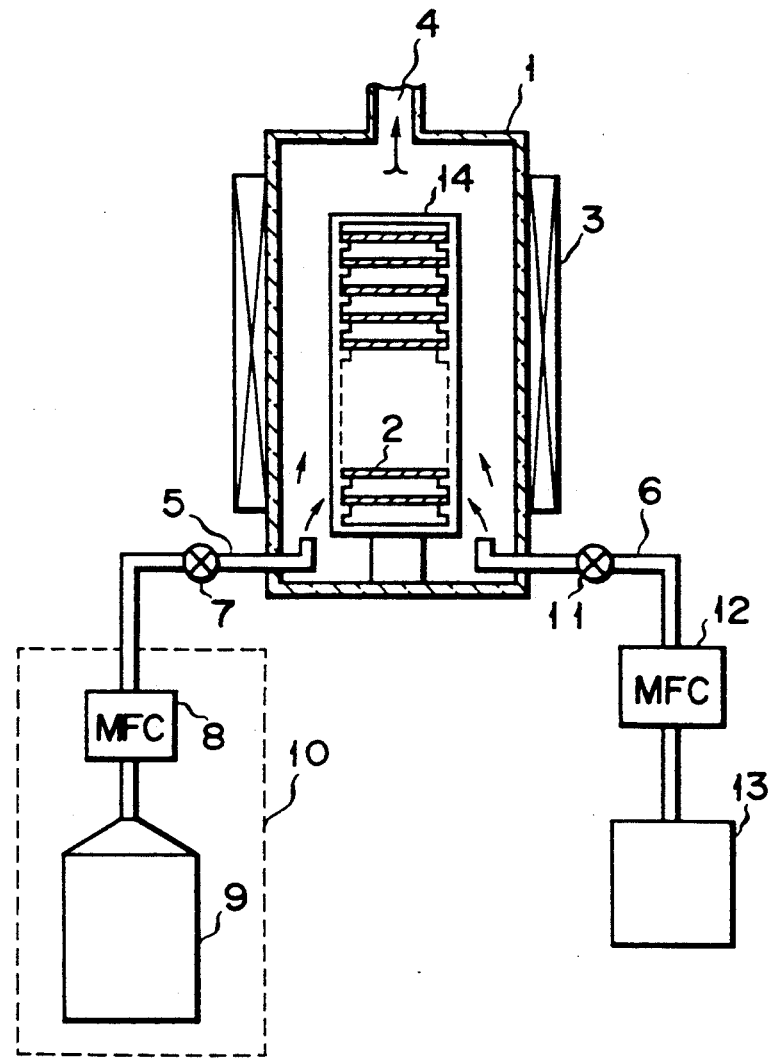
F I G. 1

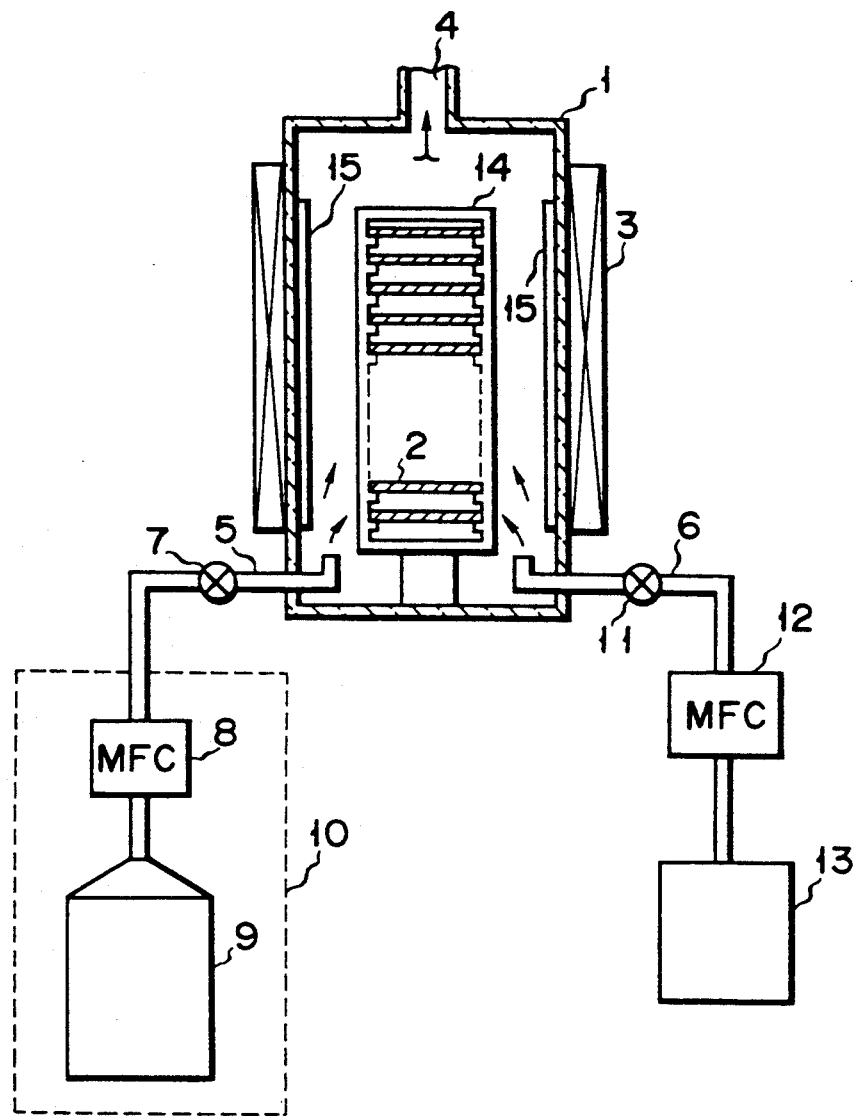
F I G. 2

METHOD OF MANUFACTURING SILICON NITRIDE FILM

BACKGROUND OF THE INVENTION

1. Field of the Invention

The present invention relates to a method of manufacturing a silicon nitride film.

2. Description of the Related Art

Conventionally, silicon nitride ($Si_xN_y$) is a solid and chemically inert dielectric material having a very high hardness, a low thermal conductivity, and high resistance to molecular diffusion. Due to these properties, silicon nitride is used as an oxidation mask, a gate insulating film, a passivation film, or the like in, e.g., the manufacture of a semiconductor device. A method of forming a silicon nitride film on a substrate, e.g., the surface of a semiconductor substrate is disclosed in Published Examined Japanese Patent Application No. 60-10108. According to this method, a substrate is arranged in a reaction tube, a gas mixture of dichlorosilane and ammonia flows in the reaction tube, and the substrate is brought into contact with the gas mixture at a low pressure and a high temperature of 700° C. to deposit a silicon nitride film on the substrate by thermal decomposition. The reaction of dichlorosilane and ammonia is given by the following formula:

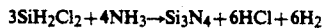

$$3SiH_2Cl_2 + 4NH_3 \rightarrow Si_3N_4 + 6HCl + 6H_2$$

In order to obtain a high growth rate of a film, uniform deposition, and a high-quality film in an economical process, ammonia must flow in the reaction tube at a gas flow rate five times that of dichlorosilane.

However, since excessive ammonia flows in the reaction tube, non-reacted ammonia remains in the reaction tube. As is apparent from the above reaction formula, hydrochloric acid produced as a reaction product is reacted with the excessive ammonia to produce ammonium chloride. Although ammonium chloride is not solidified at a temperature of 150° C. or more, ammonium chloride is deposited in a solid state at a temperature of less than 50° C. For this reason, since portions in the reaction tube or tubes coupled thereto have a temperature of less than 150° C., e.g., portions located on a downstream side from gas supply and exhaust ports in a normal low-pressure CVD (Chemical Vapor Deposition) furnace have a temperature of 150° C. or less, ammonium chloride is deposited on these portions. The ammonium chloride deposited as described above is removed from the inner wall of the reaction tube when the pressure in the reaction tube is changed from the atmospheric-pressure state to a low-pressure state or changed from the low-pressure state to the atmospheric-pressure state, and the ammonium chloride is present as particles in the reaction tube. Therefore, the particles are attached on the substrate surface. In addition, when ammonium chloride is attached on a metal portion exposed to the reaction region and having a relatively low temperature of 150° C. or less, the metal portion on which the ammonium chloride is attached is corroded by moisture remaining in the reaction tube due to loading or unloading of the substrate. For this reason, the reaction tube must be periodically washed or heated to remove ammonium chloride.

In order to prevent deposition of ammonium chloride, silane ($SiH_4$) may be used in place of dichlorosilane. In this case, however, since it is difficult to control a deposition speed of silicon nitride, the thickness of a silicon nitride film formed on the surface of the substrate is difficult to uniformize. For example, a thicknesses distribution of a silicon nitride film is not uniform in each wafer, or silicon nitride films having the same thickness cannot be obtained on a plurality of wafers.

SUMMARY OF THE INVENTION

The present invention has been made in consideration of the above problem, and has as its object to provide a method of manufacturing a silicon nitride film. According to this method, when a silicon nitride film is formed on a substrate surface, ammonium chloride is not produced. For this reason, even when the pressure in a reaction tube is changed, ammonium nitride particles are not attached on the silicon nitride film formed on the substrate surface, and an metal portion such as a reaction vessel is not corroded because no ammonium nitride is attached on the metal portion. In addition, the thickness of the silicon nitride film formed on the substrate surface can be uniformed.

According to a method of manufacturing a silicon nitride film of the present invention, one of an organic compound gas containing silicon and nitrogen as constituting elements but not containing chlorine, and a gas mixture of this organic compound gas and another gas containing at least nitrogen as a constituting element but not containing chlorine is brought into contact with a substrate surface at a low pressure to form a silicon nitride film on the substrate surface. In addition, an organic compound gas or gas mixture is decomposed to be brought into contact with a substrate surface using at least one means of a heating operation, production of a plasma, excitation by a radiation beam. The above another gas contains at least one of ammonia and nitrogen. The organic compound gas contains an amine group.

According to the method of manufacturing a silicon nitride film arranged as described above, the organic compound gas containing silicon and nitrogen as constituting elements but not containing chlorine is circulated and brought into contact with the substrate surface to deposit silicon nitride. Therefore, the gas can be in uniform contact with the substrate surface, and a deposition rate of the film can be easily controlled thereby obtaining a uniform film. During the step of forming the film, an unnecessary solid product such as ammonium chloride is not produced, and a metal portion is not corroded by the product. In addition, in deposition of silicon nitride, since a gas decomposing means such as a combination of mixing of ammonia or nitrogen, heating, production of a plasma, or excitation by a radiation beam is also used, the films can be further effectively formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodi- FIG. 1 is a schematic view showing a low-pressure CVD device for performing a method of manufacturing a silicon nitride film according to the first embodiment of the present invention; and FIG. 2 is a schematic view showing a low-pressure CVD device for performing a method of manufacturing a silicon nitride film according to the second embodiment of the present invention.

DETAILED DESCRIPTION OF THE PREFERRED EMBODIMENTS

An embodiment of the present invention will be described below. FIG. 1 is a schematic view showing a low-pressure CVD device for performing the first embodiment of the present invention. Referring to FIG. 1, reference numeral 1 denotes a vertical tubular furnace for constituting a reaction tube. Substrates, a plurality of semiconductor wafers 2 each having a diameter of 6" are arranged in the reaction tube, a pressure of which is decreased to a predetermined pressure. A heater 3 is mounted on the outer wall of the reaction tube to heat the inside of the reaction tube to a desired temperature. An exhaust port 4 coupled to a vacuum pump (not shown) for exhausting air from the furnace to decrease the pressure thereof is formed in the upper portion of the tubular furnace 1. A first gas supply tube 5 for supplying an organic compound gas containing silicon and an amine group, e.g., $Si(N(CH_3)_2)_4$, to the inside of the tubular furnace 1 and a second gas supply tube 6 for supplying ammonia ($NH_3$) to the inside of the tubular furnace 1 extend through the outer wall of the tubular furnace 1 such that one end of each of the supply tubes 5 and 6 is open to the inside of the tubular furnace 1. A baking tank 10 for supplying an organic compound gas is coupled to the other end of the first gas supply tube 5. The baking tank 10 is obtained such that a first valve 7 for opening/closing the gas flow path, a first gas flow rate controller for adjusting the gas flow rate, and a gas generator for generating the organic compound gas are coupled to the first gas supply tube 5 toward the upperstream of the supply tube 5. A second valve 11 for opening/closing a gas flow path, a second gas flow rate controller 12 for adjusting the gas flow rate, and a second gas source 13 for supplying ammonia are arranged to the other end of the second gas supply tube 6. Each of the plurality of semiconductor wafers 2 arranged in the tubular furnace 1 is horizontally held in each of a plurality of shelf portions of a quartz boat 14 provided in the furnace 1 so as to have a space for circulating a gas between the semiconductor wafers 2. The heater 3 is uniformly mounted on the outer wall of the tubular furnace 1 to keep the temperature of the outer wall constant and to minimize local differences in temperature in the tubular furnace 1. The intervals between the shelf portions for arranging the semiconductor wafers 2 are not necessarily equal to each other, and the semiconductor wafers 2 are preferably arranged according to the relationship between the concentration, volume, and temperature of a flowing gas. Although not shown or described, the temperature and pressure in the tubular furnace 1 are measured by a general-purpose means, i.e., a thermometer and a vacuum gauge, and a control means having an adjuster for adjusting the measurement value within a predetermined range in the furnace 1, thereby keeping the temperature and pressure in the furnace 1 at desired values.

A process for manufacturing a silicon nitride film on a semiconductor wafer in a method of manufacturing a silicon nitride film according to the present invention using the above arrangement will be described below. The plurality of semiconductor wafers 2 were horizontally set one by one on the shelf portions of the boat 14 arranged in the tubular furnace 1. That is, the wafers were set such that the wafer surfaces were perpendicular pendicular to a gas flow. The temperature in the tubular furnace 1 was kept at a temperature of 700° C. using the heater 3 arranged on the outer wall of the furnace. The pressure in the furnace was kept at a pressure of 0.5 Torr by driving the vacuum pump (not shown), and an organic compound gas, i.e., a vapor of $Si(N(CH_3)_2)_4$ was generated from the gas generator 8 of the baking tank 10. The valve 7 was open while the gas flow rate was controlled by the first gas flow rate controller 9, thereby supplying the organic compound gas at a flow rate of 100 SCCM. At the same time, the second valve 11 was open while a gas flow rate was adjusted by the second gas flow rate controller 12 to supply ammonia from the second gas source 13 to the furnace at a flow rate of 1,000 SCCM. The temperature and pressure in the tubular furnace 1 were kept as described above, and the two types of gases were continuously supplied to the inside of the furnace for 60 minutes. The first and second valves were closed. Thereafter, the semiconductor wafers 2 were removed from the furnace. When a deposition state of a silicon nitride film on the surface of each of the removed semiconductor wafers 2 was checked, a silicon nitride film having a thickness of 600 Å was formed. The silicon nitride film was deposited on each wafer to have a uniform thickness, and the uniformity of the nitride films of the wafers at arbitrary positions in the same furnace was held within ±5%.

Upon completion of the film formation step, when deposits in the furnace and the tubes of the exhausting system was checked, no corrosive deposits could be detected.

The conditions of the above embodiment were changed, i.e., the temperature in the furnace was controlled within a range of 300° C. to 1,000° C., and the pressure in the furnace was controlled within a range of 1 mTorr to 10 Torr. When silicon nitride films were formed under these conditions, uniform films could be obtained within the above ranges.

When $SiH(N(CH_3)_2)_3$, $SiH_2(N(CH_3)_2)_2$, or $SiH_3(N(CH_3)_2)$ which does not contain chlorine as a constituting element was used as an organic compound gas in place of $Si(N(CH_3)_2)_4$, a uniform film could be obtained as described above. In addition, when a silicon nitride film was formed using nitrogen in place of ammonia in the above embodiment by setting a time required for supplying the gas to the furnace to be longer than that of the above embodiment to prolong a time for keeping the gas n contact with the semiconductor wafer 2, films could be uniformly formed. When only the organic compound gas was used, although film formation required a long time, films could be uniformly formed.

FIG. 2 is a schematic view showing a low-pressure CVD device for performing the second embodiment of the present invention. The same reference numerals as in FIG. 1 denote the same parts in FIG. 2, and a detailed description thereof will be omitted. A pair of electrodes 15 are arranged on the inner wall of a tubular furnace 1 and are coupled to an AC power source (not shown).

With the above arrangement, a gas flowed in a furnace 1 while the pressure in the tubular furnace 1 was decreased, and a predetermined voltage was applied to the pair of electrodes 15. In this case, a plasma was produced from any one of $Si(N(CH_3)_2)_4$, $SiH(N(CH_3)_2)_3$, $SiH_2(N(CH_3)_2)_2$, and $SiH_3(N(CH_3)_2)$ gases to be decomposed inside the tubular furnace. Uniform silicon nitride films could be effectively formed on the surfaces of the semiconductor wafers 2. Note that, since the plasma was produced from the gas, the reaction temperature was decreased to 300° C. Although the plasma was produced from the gas as a means for decomposing the gas, when an ultraviolet beam was radiated on the gas to excite and decompose the gas, same result as described above could be obtained. Other radiation beams may be used in place of the ultraviolet beam. The plasma may be produced from the gas or the gas may be excited by a radiation beam while a heating operation is performed.

As is apparent from the above description, according to the present invention, when a silicon nitride film is formed on a substrate surface, an organic compound gas which contains silicon and nitrogen but not containing chlorine as constituting elements is used, and the substrate and the gas are reacted at a low pressure. In this case, the following effects can be obtained. A silicon nitride film formed on each substrate surface can be uniformly distributed on the substrate to have a predetermined thickness. Differences in thicknesses of silicon nitride films on a plurality of substrate can be decreased. Since an unnecessary solid product is not produced and therefore is not attached on the silicon nitride film, an exposed metal portion such as a reaction vessel is not corroded.

Additional advantages and modifications will readily occur to those skilled in the art. Therefore, the invention in its broader aspects is not limited to the specific details, and illustrated examples shown and described herein. Accordingly, various modifications may be without departing from the spirit or scope of the general inventive concept as defined by the appended claims and their equivalents.

What is claimed is:

1. A method of manufacturing a silicon nitride film on a semiconductor substrate using a low-pressure CVD apparatus, comprising the steps of:

setting a plurality of semiconductor wafers in a boat of a reaction tube;

increasing a temperature in said reaction tube to a specified temperature and decreasing a pressure in said reaction tube to a specified pressure;

supplying a first gas selected from the group consisting of $Si(N(CH_3)_2)_4$, $SiH(N(CH_3)_2)_3$, $SiH_2(N(CH_3)_2)_2$, and $siH_3(N(CH_3)_2)$ from a first gas source to said reaction tube and supplying a second gas selected from the group consisting of $N_2$ and $NH_3$ from a second gas source to said reaction tube; and producing a plasma from said first and second gases supplied in said reaction tube.

2. A method of manufacturing a silicon nitride film on a semiconductor substrate using a low-pressure CVD apparatus, comprising the steps of:

setting a plurality of semiconductor wafers in a boat of a reaction tube;

increasing a temperature in the reaction tube to a specified temperature and decreasing a pressure in the reaction tube to a specified pressure;

supplying a first gas selected from the group consisting of $si(N(CH_3)_2)_4$, $SiH(N(CH_3)_2)_3$, $SiH_2(N(CH_3)_2)_2$, and $SiH_3(N(CH_3)_2)$ from a first gas source to the reaction tube and supplying a second gas selected from the group consisting of $N_2$ and $NH_3$ from a second gas source to the reaction tube; and radiating an ultraviolet beam on the first and second gases supplied in the reaction tube.

3. The method according to claim 1, wherein:

the specified temperature in the reaction tube is about 300° C.;

the specified pressure in the reaction tube is about 0.5 Torr;

the flow rate of the first gas is about 100 SCCM; and the flow rate of the second gas is about 1000 SCCM.

4. The method according to claim 2, wherein:

the specified temperature in the reaction tube is about 700° C;

the specified pressure in the reaction tube is about 0.5 Torr;

the flow rate of the first gas is about 100 SCCM; and the flow rate of the second gas is about 1000 SCCM.

5. The method according to claim 1, wherein the step of increasing the temperature in the reaction tube to a specified temperature is carried out simultaneously with the step of producing a plasma.

6. The method according to claim 2, wherein the step of increasing the temperature in the reaction tube to a specified temperature is carried out simultaneously with the step of radiating an ultraviolet beam.

* * * * *